(12) United States Patent
Yamada et al.

(10) Patent No.: US 11,005,445 B2
(45) Date of Patent: May 11, 2021

(54) ELECTRONIC COMPONENT INCLUDING A PAD ELECTRODE AND A BUMP STACKED ON A WIRING ELECTRODE

(71) Applicant: Murata Manufacturing Co., Ltd., Nagaokakyo (JP)

(72) Inventors: Ryuta Yamada, Nagaokakyo (JP); Yasuyuki Toyota, Nagaokakyo (JP); Masaharu Fujiya, Nagaokakyo (JP); Toru Takeshita, Nagaokakyo (JP); Masaaki Shimada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/711,487

(22) Filed: Dec. 12, 2019

(65) Prior Publication Data

US 2020/0204152 A1    Jun. 25, 2020

(30) Foreign Application Priority Data

Dec. 19, 2018  (JP) .............................. JP2018-236994
Sep. 19, 2019  (JP) .............................. JP2019-170015

(51) Int. Cl.
*H03H 9/05*    (2006.01)

(52) U.S. Cl.
CPC ... *H03H 9/059* (2013.01); *H01L 2224/32225* (2013.01); *H01L 2924/01013* (2013.01); *H01L 2924/01029* (2013.01); *H01L 2924/01079* (2013.01)

(58) Field of Classification Search
CPC .......... H03H 9/059; H01L 2224/32225; H01L 2924/01013; H01L 2924/01029; H01L 2924/01079; H01L 2224/32245; H01L 2924/01022; H01L 2924/01108; H01L 2924/01104
See application file for complete search history.

(56) References Cited

U.S. PATENT DOCUMENTS

| 2002/0024271 | A1  | 2/2002  | Hori et al. |
| 2008/0257596 | A1  | 10/2008 | Kaneko |
| 2009/0242261 | A1  | 10/2009 | Takenaka et al. |
| 2017/0250330 | A1* | 8/2017  | Maki .................... H01L 25/0753 |
| 2017/0338174 | A1* | 11/2017 | Hu ......................... H01L 23/145 |

FOREIGN PATENT DOCUMENTS

| JP | 2002-100951 A    | 4/2002  |
| JP | 2008-270346 A    | 11/2008 |
| JP | 2010-098385 A    | 4/2010  |
| KR | 10-2010-0090806 A | 8/2010  |

OTHER PUBLICATIONS

Official Communication issued in corresponding Korean Patent Application No. 10-2019-0168882, dated Mar. 16, 2021.

* cited by examiner

*Primary Examiner* — Douglas W Owens
(74) *Attorney, Agent, or Firm* — Keating & Bennett, LLP

(57) ABSTRACT

An electronic component including a pad electrode provided on a wiring electrode and a Au bump provided on the pad electrode, wherein the uppermost layer of the wiring electrode is a first Ti layer, the uppermost layer of the pad electrode is a Au layer, and the thickness of the first Ti layer in at least a portion on which the Au bump is superposed in plan view is greater than the thickness of at least a portion of the first Ti layer in a portion on which the Au bump is not superposed in plan view.

13 Claims, 14 Drawing Sheets

ELECTRONIC COMPONENT INCLUDING A PAD ELECTRODE AND A BUMP STACKED ON A WIRING ELECTRODE

CROSS REFERENCE TO RELATED APPLICATIONS

This application claims the benefit of priority to Japanese Patent Application No. 2018-236994 filed on Dec. 19, 2018 and Japanese Patent Application No. 2019-170015 filed on Sep. 19, 2019. The entire contents of this application are hereby incorporated herein by reference.

BACKGROUND OF THE INVENTION

1. Field of the Invention

The present invention relates to an electronic component including a pad electrode and a Au bump that are stacked on a wiring electrode.

2. Description of the Related Art

Japanese Unexamined Patent Application Publication No. 2002-100951 discloses a structure in which a pad electrode and a Au bump are stacked on a wiring electrode. In this regard, the uppermost layer of the wiring electrode is formed of Ti. The pad electrode disposed on the wiring electrode includes a Ti layer, a Pt layer, and a Au layer from the bottom. A Au bump is bonded to the Au layer.

Regarding the electronic component described in Japanese Unexamined Patent Application Publication No. 2002-100951, if the Ti layer located as the uppermost layer of the wiring electrode is thick, the resistance value of the wiring electrode increases. As a result, there is a problem in that the loss increases. On the other hand, the inventors of preferred embodiments of the present invention discovered that, when the Ti layer as the uppermost layer of the wiring electrode was thin, the amount of Ti deposited on the Au layer increased. Consequently, the bonding strength between the Au layer and the Au bump may be reduced.

SUMMARY OF THE INVENTION

Preferred embodiments of the present invention provide electronic components in each of which the loss is reduced and a reduction in the bonding strength between a Au layer and a Au bump does not readily occur.

According to a preferred embodiment of the present invention, an electronic component includes a wiring electrode, a pad electrode provided on the wiring electrode, and a Au bump provided on the pad electrode, wherein the uppermost layer of the wiring electrode is a first Ti layer, the uppermost layer of the pad electrode is a Au layer, and a thickness of the first Ti layer in at least a portion on which the Au bump is superposed in plan view is greater than a thickness of at least a portion of the first Ti layer in a portion on which the Au bump is not superposed in plan view.

According to preferred embodiments of the present invention, electronic components in each of which the loss is reduced and the bonding strength between the Au layer and the Au bump is sufficiently high are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments according to the present invention with reference to the drawings.

Each of the preferred embodiments described in the present specification is an exemplification and configurations shown in different preferred embodiments may be partially replaced or combined with each other.

Figure 1:
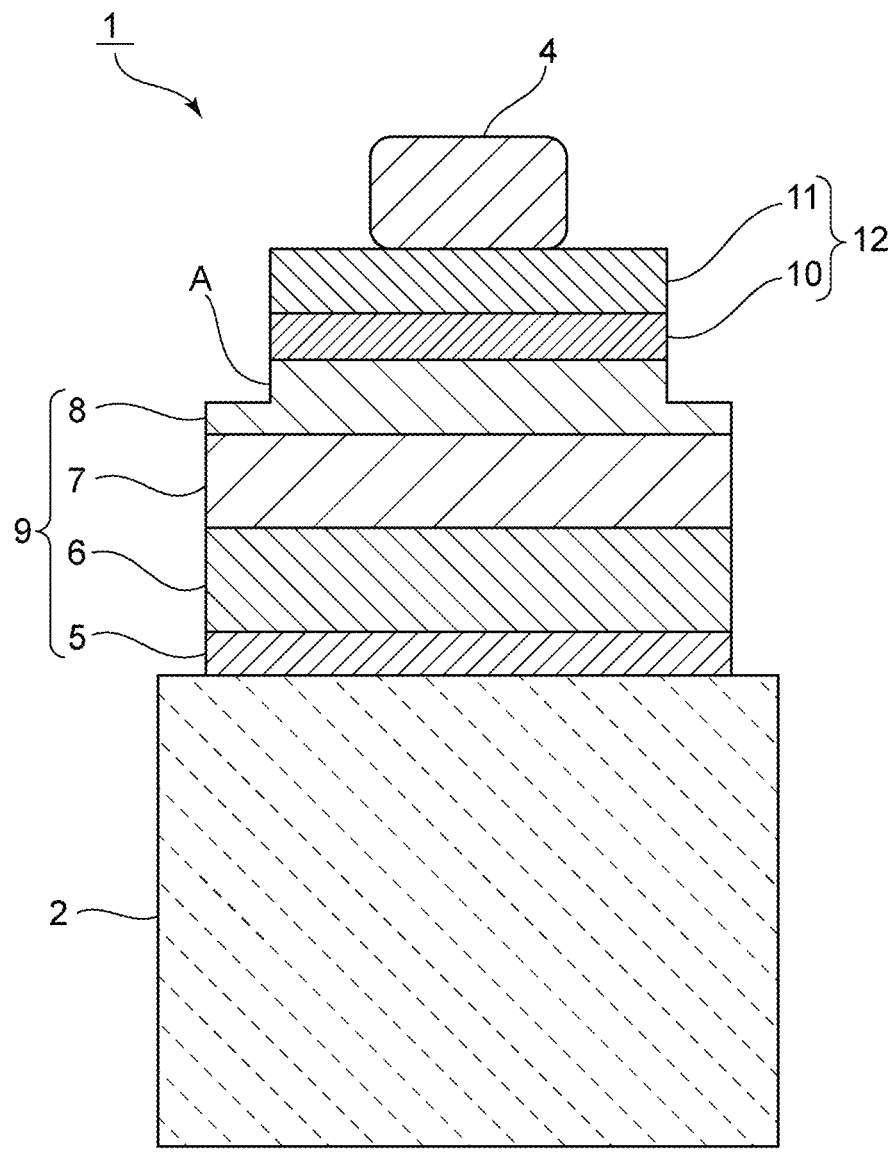
FIG. 1 is a sectional front view showing a portion of an electronic component according to a first preferred embodiment of the present invention.
Figure 2:
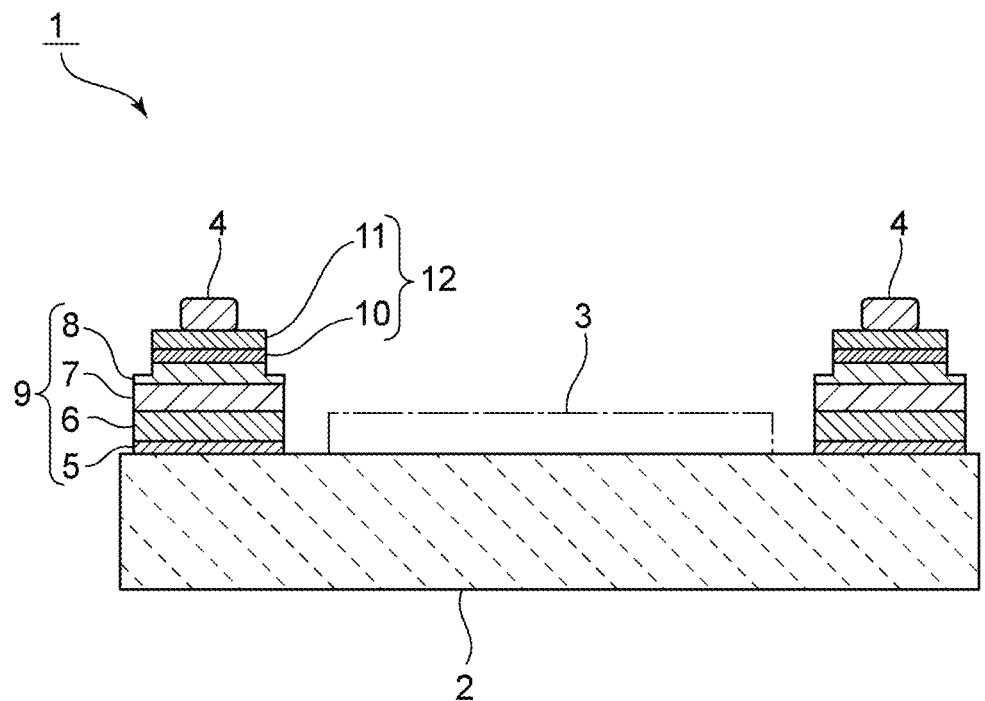
FIG. 2 is a sectional front view showing the electronic component according to the first preferred embodiment of the present invention.

FIG. 1 is a sectional front view showing a portion of an electronic component according to a first preferred embodiment of the present invention, and FIG. 2 is a sectional front view showing the electronic component. As shown in FIG. 2, the electronic component 1 includes a substrate 2. A functional electrode 3 is provided on the substrate 2. The functional electrode 3 is an electrode that enables the electronic component 1 to define and function as an electronic component. There is no particular limitation regarding the combination of the substrate 2 and the functional electrode 3. For example, a piezoelectric substrate may be used as the substrate 2, and an interdigital transducer electrode may be used as the functional electrode 3. In this case, an acoustic wave device may be provided as the electronic component 1. However, there is no particular limitation regarding the substrate 2 and the functional electrode 3 in preferred embodiments of the present invention.

The electronic component 1 includes a Au bump 4 and is surface-mountable on a printed circuit board or the like. More specifically, a wiring electrode 9 is provided on the substrate 2. In FIG. 2, the wiring electrode 9 is isolated from the functional electrode 3 but is electrically connected to the functional electrode 3 in a portion not shown in the drawing. A pad electrode 12 is provided on the wiring electrode 9. The Au bump 4 is bonded to the pad electrode 12.

In plan view, the wiring electrode 9 is larger than the pad electrode 12, and the wiring electrode 9 includes a portion located outside the pad electrode 12.

The uppermost layer of the wiring electrode 9 is a first Ti layer 8. In the first preferred embodiment, the wiring electrode 9 preferably includes a third Ti layer 5, an Al layer 6, an AlCu layer 7, and the first Ti layer 8, for example. The material of the AlCu layer 7 is preferably an AlCu alloy including mainly Al, for example. There is no particular limitation regarding the composition ratio of the alloy, and an AlCu alloy including about 10% by weight of Cu relative to 100% by weight of Al, for example, is preferably used in the first preferred embodiment.

In addition, in the first preferred embodiment, the pad electrode 12 includes a second Ti layer 10 and a Au layer 11 stacked on the second Ti layer 10. Since the Au layer 11 is made of Au, when the Au bump 4 is bonded to the Au layer 11, the bonding strength between the two is sufficiently high.

The electrical conductivity is improved by the Al layer 6 and the AlCu layer 7. The first Ti layer 8 significantly reduces or prevents diffusion of Al from the AlCu layer 7 and the Al layer 6 to the pad electrode 12.

In this regard, if the thickness of the first Ti layer 8 increases, the loss increases. Then, the thickness of at least a portion of the first Ti layer 8 in a portion on which the Au bump 4 is not superposed is set to be less than the thickness of the first Ti layer 8 in a portion on which the Au bump 4 is superposed. More specifically, a raised portion A is provided on the upper surface of the first Ti layer 8. There is no particular limitation regarding the raised portion A, and in the first preferred embodiment, the raised portion A preferably extends from the peripheral edge of the pad electrode 12. The thickness of the portion located outside the raised portion A, that is, outside the pad electrode 12, of the first Ti layer 8 is set to be small. As a result, an increase in the loss due to resistance is significantly reduced or prevented.

On the other hand, the inventors of preferred embodiments of the present invention discovered that if the thickness of the first Ti layer 8 provided as the uppermost layer of the wiring electrode 9 was small, the amount of Ti deposited on the upper surface of the pad electrode 12, that is, the upper surface of the Au layer 11, was large. Conversely, it was discovered that if the thickness of the first Ti layer 8 was large, the amount of Ti deposited on the upper surface of the pad electrode 12, that is, the upper surface of the Au layer 11, was small. This will be described with reference to the examples below.

An electrode multilayer structure was provided by using a $LiNbO_3$ substrate as the substrate 2 and forming films of the wiring electrode 9 and the pad electrode 12 by a vacuum evaporation method. In this case, after film formation, heat treatment was performed at a temperature of about 275° C. for about 1 hour.

Experimental Example 1

Wiring electrode 9:
Film thickness of third Ti layer 5: about 100 nm
Film thickness of Al layer 6: about 1,200 nm
Film thickness of AlCu layer 7: about 1,000 nm
Film thickness of the portion of the first Ti layer 8 including the raised portion A: 0 nm, about 50 nm, about 200 nm, or about 300 nm
Film thickness of the portion of the first Ti layer 8 not including the raised portion A: 0 nm, about 30 nm, about 180 nm, or about 280 nm
Pad electrode 12:
Film thickness of second Ti layer 10: about 150 nm
Film thickness of Au layer 11: about 250 nm As described above, the film thickness of the first Ti layer 8 inside the raised portion A was set to be 0 nm, about 50 nm, about 200 nm, or about 300 nm. In this regard, 0 nm denotes that the first Ti layer 8 is not provided. Therefore, the structure in which the film thickness inside the raised portion A is 0 nm is the comparative example.

Figure 3:
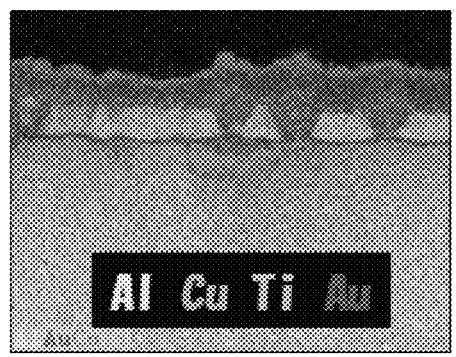
FIG. 3 is an EDX image of the electrode multilayer structure in an acoustic wave device of a comparative example in which the thickness of a first Ti layer is 0 nm, that is, no first Ti layer is included.
Figure 4A:
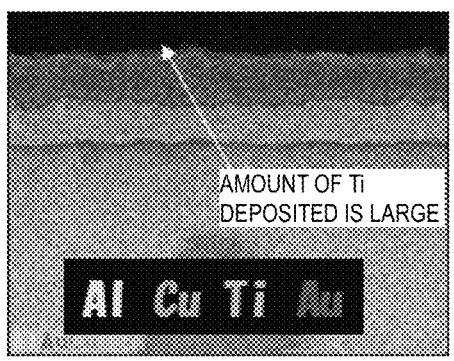
FIG. 4A is an EDX image of the electrode multilayer structure in an electronic component of an example in which the thickness of a first Ti layer is about 50 nm.
Figure 4B:
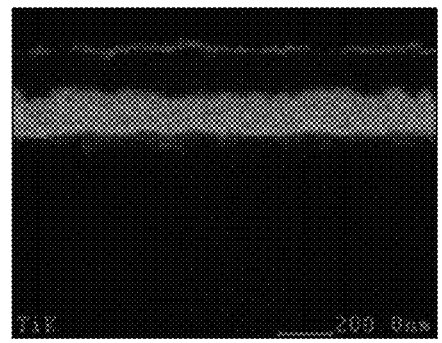
FIG. 4B is an EDX image when Ti is deposited alone.
Figure 5A:
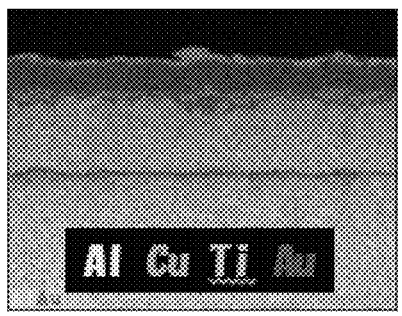
FIG. 5A is an EDX image of the electrode multilayer structure in an electronic component of an example in which the thickness of a first Ti layer is about 200 nm.
Figure 5B:
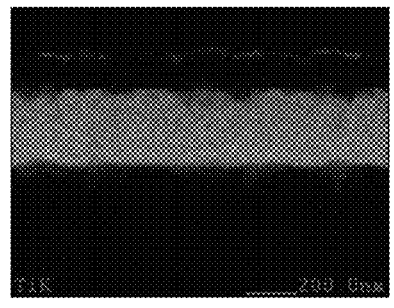
FIG. 5B is an EDX image when Ti is deposited alone.
Figure 6A:
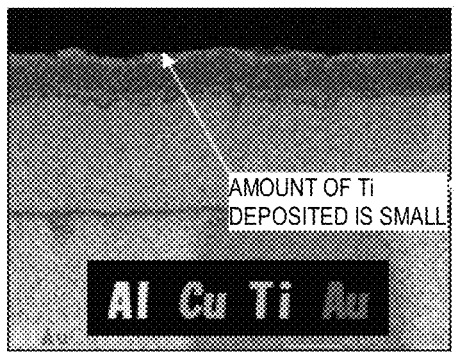
FIG. 6A is an EDX image of the electrode multilayer structure in an electronic component of an example in which the thickness of a first Ti layer is about 300 nm.
Figure 6B:
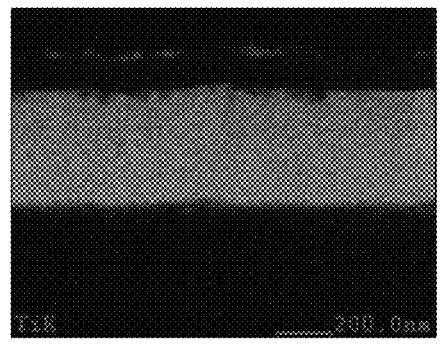
FIG. 6B is an EDX image when Ti is deposited alone.

FIG. 3 is an EDX image of the electrode multilayer structure of the comparative example. Each of FIG. 4A, FIG. 5A, and FIG. 6A is an EDX image of the electrode multilayer structure in which the film thickness of the first Ti layer 8 inside the raised portion A was 50 nm, 200 nm, or 300 nm. Each of FIG. 4B, FIG. 5B, and FIG. 6B is an EDX image when Ti was deposited alone.

The EDX image was a color image. However, each of FIG. 3 to FIG. 6B is a monochrome image. Since heat was applied after film formation, Ti in the first Ti layer 8 and the second Ti layer 10 was deposited on the upper surface of the Au layer 11 of the pad electrode 12. In particular, as indicated by the arrow, in the case in which the film thickness of the first Ti layer 8 was about 50 nm, the amount of Ti deposited on the Au layer 11 was large. On the other hand, as shown in FIG. 5B and FIG. 6B, the amount of Ti deposited was decreased with increasing film thickness of the first Ti layer 8. Although the reasons for a decrease in the amount of Ti deposited on the Au layer 11 with an increase in film thickness of the first Ti layer 8 are not certain, the present inventors experimentally found that the amount of Ti deposited on the Au layer 11 was decreased to a great extent, as shown in FIG. 6B, by increasing the thickness of the first Ti layer 8.

As a result, the amount of Ti deposited on the Au layer 11 can be decreased by relatively increasing the thickness of the first Ti layer 8 in at least a portion in which the first Ti layer is superposed on the Au bump 4. Consequently, the bonding strength between the Au bump 4 and the Au layer 11 can be improved.

Therefore, (1) the loss can be reduced by providing a relatively thin portion in the first Ti layer 8, and (2) the bonding strength between the Au bump 4 and the Au layer 11 can be improved by relatively increasing the thickness of the first Ti layer 8 in a portion on which the Au bump 4 is superposed, as described above.

Figure 7:
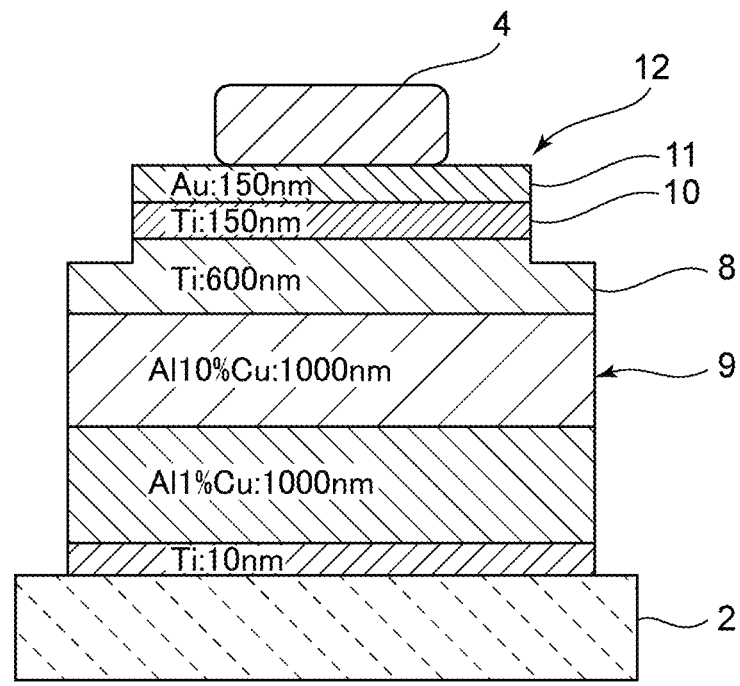
FIG. 7 is a sectional front view showing a modified example of the electronic component according to the first preferred embodiment of the present invention.
Figure 8:
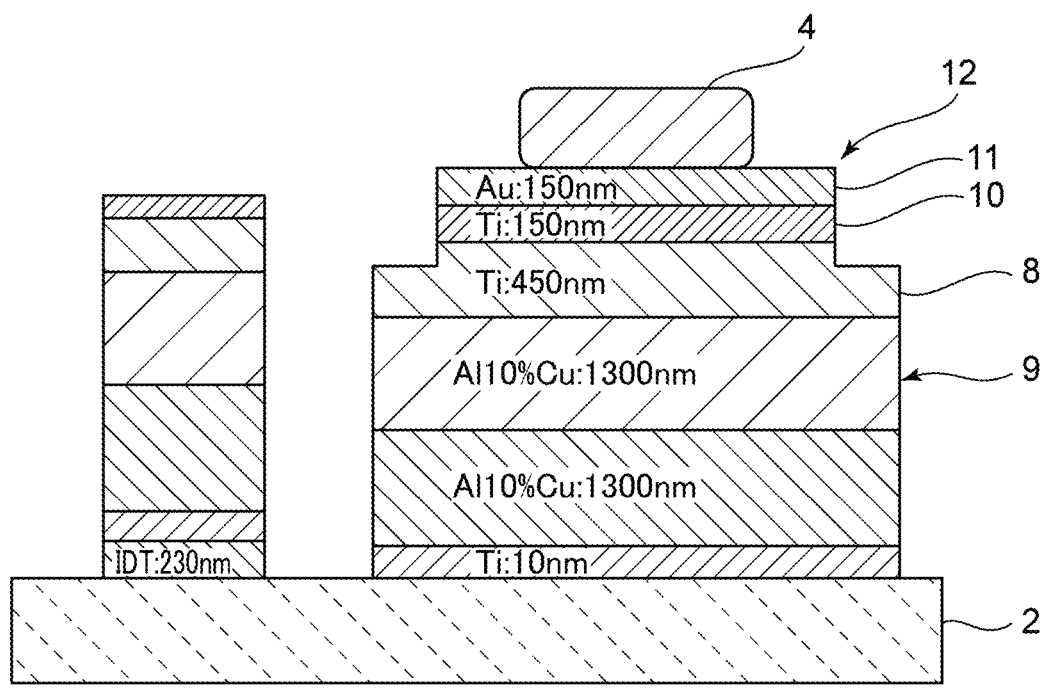
FIG. 8 is a sectional front view showing another modified example of the electronic component according to the first preferred embodiment of the present invention.

In the present experimental example, the Al layer 6 and the AlCu layer 7 were used for the wiring electrode 9. However, as shown in FIG. 7, a first AlCu layer (Cu concentration of 1%) and a second AlCu layer (Cu concentration of 10%) may be used instead of the Al layer 6 and the AlCu layer 7, respectively. Alternatively, as shown in FIG. 8, a first AlCu layer (Cu concentration of about 10%) and a second AlCu layer (Cu concentration of about 10%) may be used.

Figure 9:
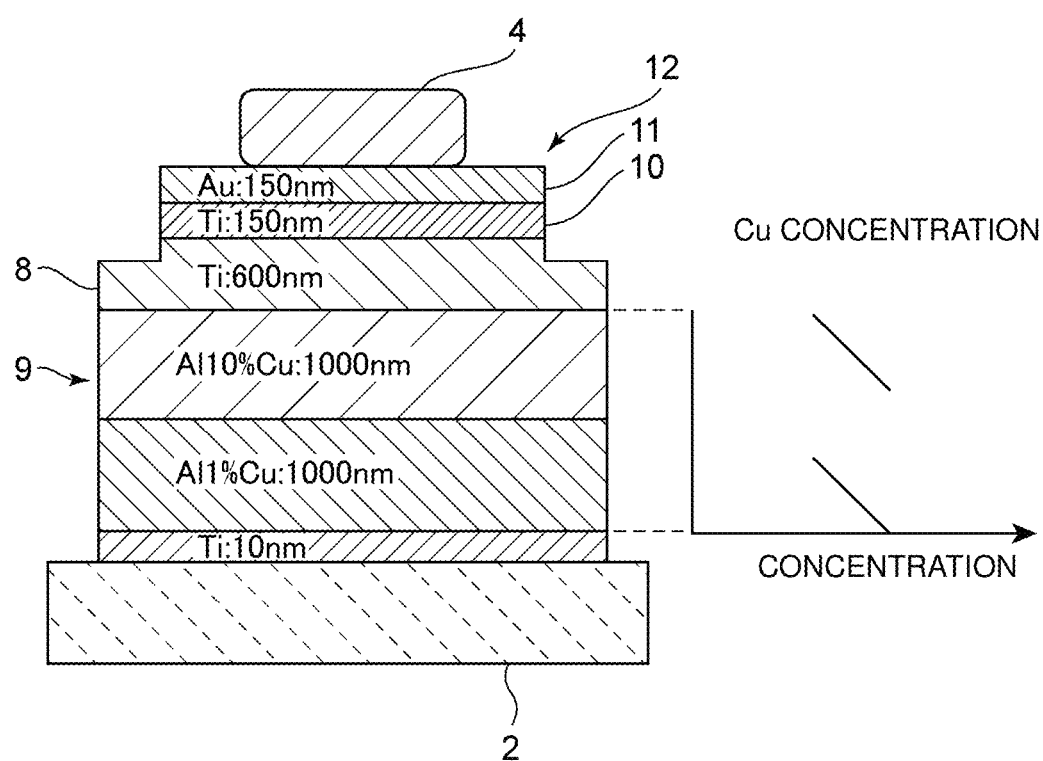
FIG. 9 is a sectional front view showing another modified example of the electronic component according to the first preferred embodiment of the present invention.

Further, as shown in FIG. 9, the Cu concentration in each of the first AlCu layer and the second AlCu layer may increase with decreasing proximity to the substrate 2.

In preferred embodiments of the present invention, preferably, the thickness of the first Ti layer 8 is set to be greater than the thickness of the second Ti layer 10, for example. In this case, the thickness of the first Ti layer 8 denotes the thickness of the first Ti layer 8 in at least a portion on which the Au bump 4 is superposed and more preferably the thickness of the first Ti layer 8 in a portion on which the Au layer 11 is superposed, for example. If the thickness of the first Ti layer 8 is less than the thickness of the second Ti layer 10, the amount of the Ti deposited on the Au layer 11 increases, and if the thickness of the first Ti layer 8 is greater than the thickness of the second Ti layer 10, the amount of Ti deposited on the Au layer 11 can be decreased.

In this regard, the thickness of the first Ti layer 8 outside the raised portion A is small. This portion having a relatively small thickness does not have the Au layer 11 superposed thereon. Therefore, the presence of the portion having a relatively small thickness does not impair a decrease in the amount of Ti deposited on the upper surface of the Au layer 11.

In the comparative example shown in FIG. 3, there are many portions in which the Au layer 11 defining and functioning as the uppermost portion penetrated the Ti layer and reached the AlCu layer 7. That is, it is assumed that Au in the Au layer 11 reached the AlCu layer 7 below and was converted to a AuAl alloy.

On the other hand, in FIG. 4A to FIG. 6B, it is clear that Au in the Au layer 11 did not reach the AlCu layer 7 below. That is, since the first Ti layer 8 was provided, an effect of significantly reducing or preventing diffusion of Au was improved by the first Ti layer 8. Therefore, it was discovered that alloying of the Au layer 11 could be significantly reduced or prevented. This is assumed to be due to the second Ti layer 10 being stacked on the first Ti layer 8. That is, it is assumed that since the second Ti layer 10 is stacked directly on the first Ti layer 8, an interface in a crystal state is provided, and Au is significantly reduced or prevented from diffusing into the first Ti layer 8 and the second Ti layer 10.

In addition, since the second Ti layer 10 is stacked directly on the first Ti layer 8, surface roughening due to insertion of a different type of metal is also significantly reduced or prevented. Therefore, the surface smoothness of the upper surface of the pad electrode 12, that is, the upper surface of the Au layer 11, is also significantly improved. Consequently, the bonding strength between the Au bump 4 and the Au layer 11 is sufficiently improved.

There is no particular limitation regarding the method for manufacturing the electrode multilayer structure in the electronic component according to preferred embodiments of the present invention. An example will be described with reference to FIG. 10 to FIG. 13.

Figure 10:
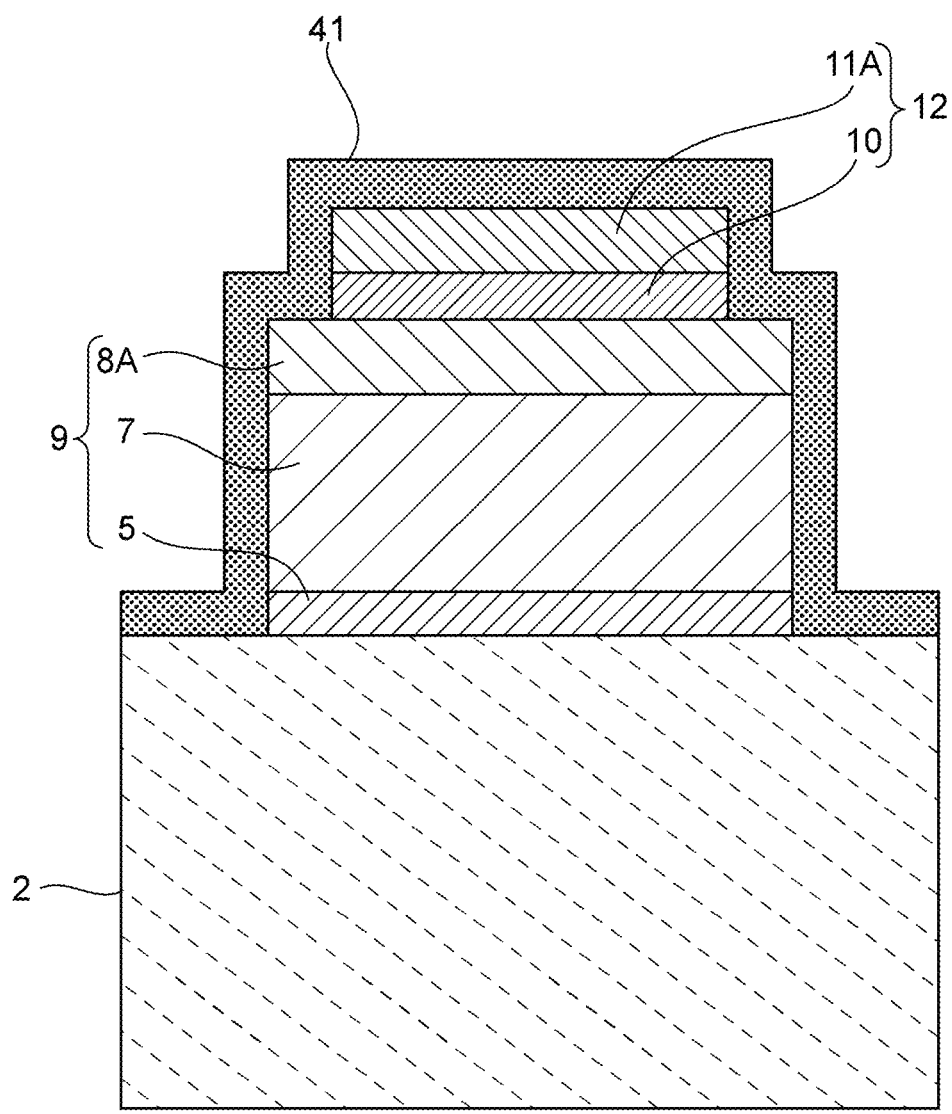
FIG. 10 is a sectional front view showing a method for manufacturing the electrode multilayer structure in an electronic component according to a preferred embodiment of the present invention.

As shown in FIG. 10, films of the third Ti layer 5, the AlCu layer 7, and the Ti layer 8A were formed in this order on a LiNbO$_3$ substrate. In this regard, the Ti layer 8A was not provided with raised portion A.

The second Ti layer 10 and the Au layer 11A were stacked on the wiring electrode 9 to form the pad electrode 12. Film formation was performed by a vacuum evaporation method. In this case, heat treatment at a temperature of room temperature to about 350° C. for about 0 to 5 hours was performed. The film thickness of each layer was set to be as described below.

Figure 11:
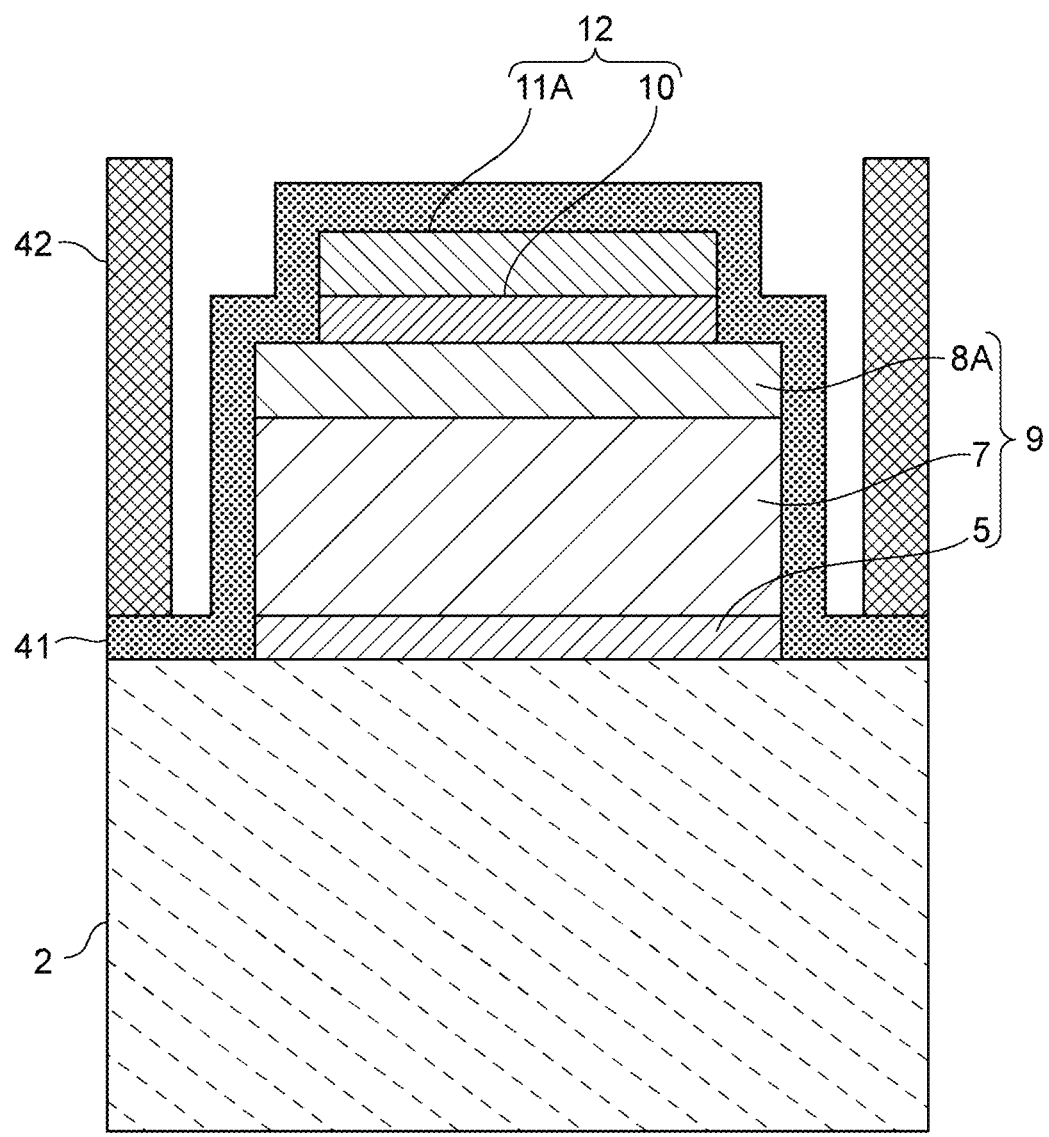
FIG. 11 is a sectional front view showing a method for manufacturing the electrode multilayer structure in an electronic component according to a preferred embodiment of the present invention and is a diagram showing the state in which a resist is formed.
Figure 12:
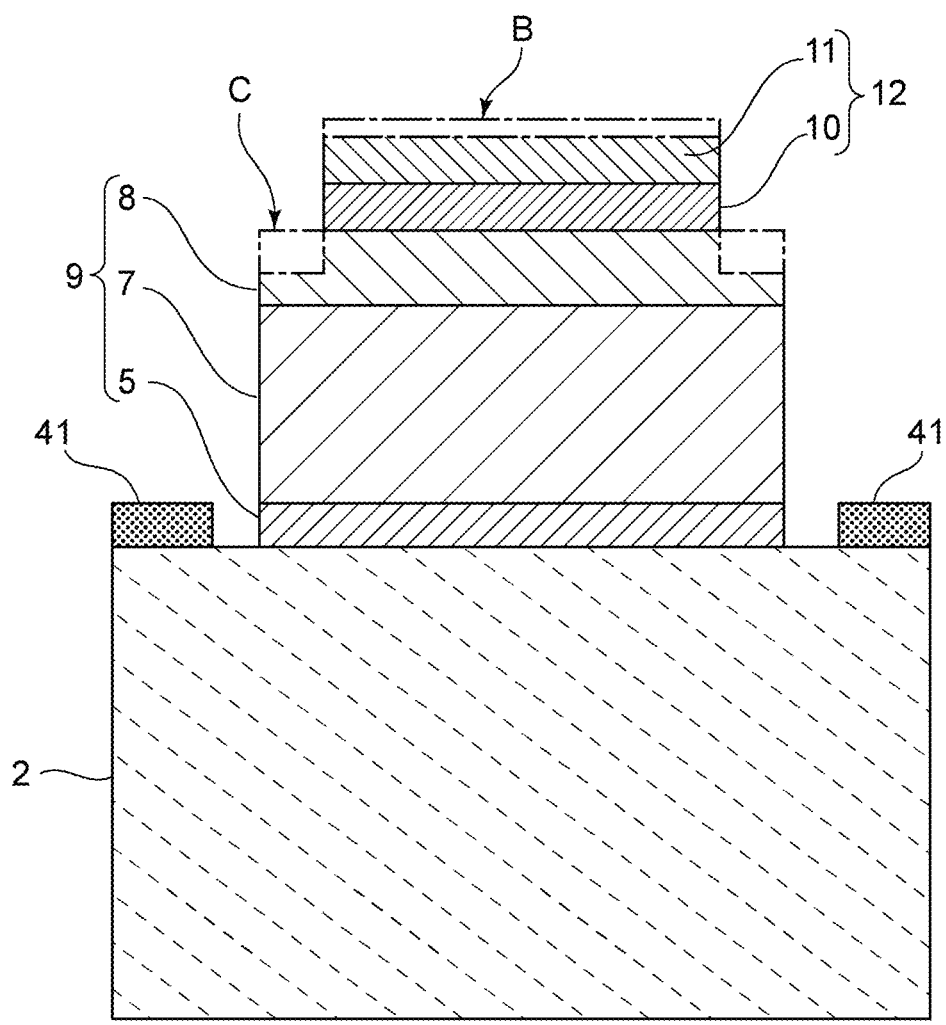
FIG. 12 is a sectional front view showing the state after the step of cutting a Au layer by etching and the step of removing a portion of the first Ti layer by etching in the steps of manufacturing the electrode multilayer structure in an electronic component according to a preferred embodiment of the present invention.
Figure 13:
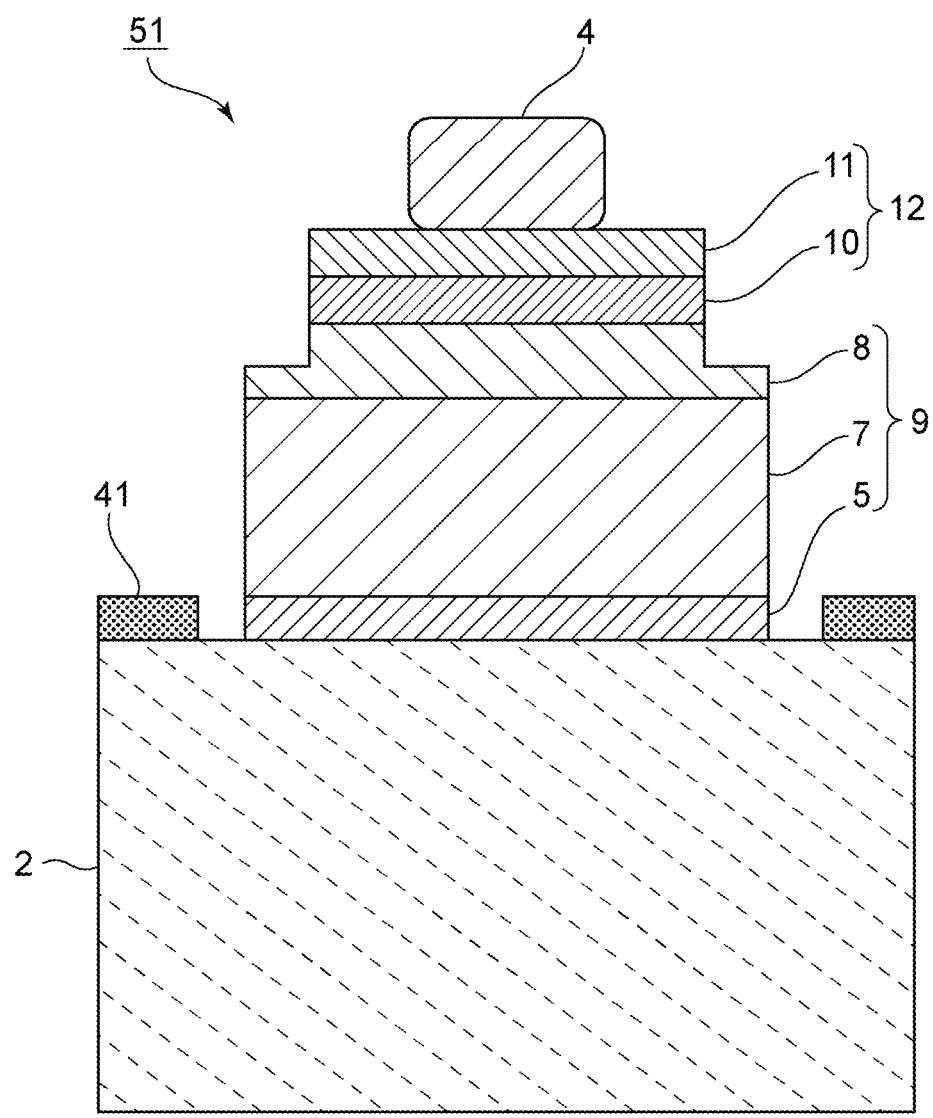
FIG. 13 is a sectional front view showing an electrode structure of an electronic component provided by the steps shown in FIG. 12.

Third Ti layer 5: about 100 nm
Film thickness of AlCu layer 7: about 2,600 nm
Film thickness of Ti layer 8A: about 450 nm
Film thickness of second Ti layer 10: about 150 nm
Film thickness of Au layer 11A: about 150 nm As shown in FIG. 10, the electrode multilayer structure was covered with a protective film 41. Regarding the protective film 41, a SiN film with a film thickness of about 70 nm was provided. Thereafter, as shown in FIG. 11, a resist layer 42 was provided. Subsequently, the protective film 41 in the portion that is not covered with the resist film 42 was removed by etching. Etching was performed, and the surface of the Au layer 11 was etched to decrease the thickness of the Au layer 11A during etching. Accordingly, the Au layer 11 shown in FIG. 12 was formed. In FIG. 12, the cut portion of the Au layer is indicated by alternate long and short dashed lines B. The film thickness of the Au layer 11 is less than about 150 nm.

Similar to the etching to form the Au layer 11, the portion exposed at the upper surface of the Ti layer 8A was etched to form the raised portion shown in FIG. 12. The portion removed by etching is indicated by the alternate long and short dashed lines C. The raised portion was formed, and, as a result, the first Ti layer 8 was formed. Accordingly, an electronic component 51 shown in FIG. 13 was obtained.

The step of etching the Ti layer 8A to have the raised portion may be performed at the same or substantially the same time as the etching step to form the Au layer 11 or may be performed in another step after a resist is further provided.

The above-described manufacturing method is an example of the method for manufacturing the electrode multilayer structure in the electronic component according to preferred embodiments of the present invention, and the manufacturing method is not limited to this.

Figure 14:
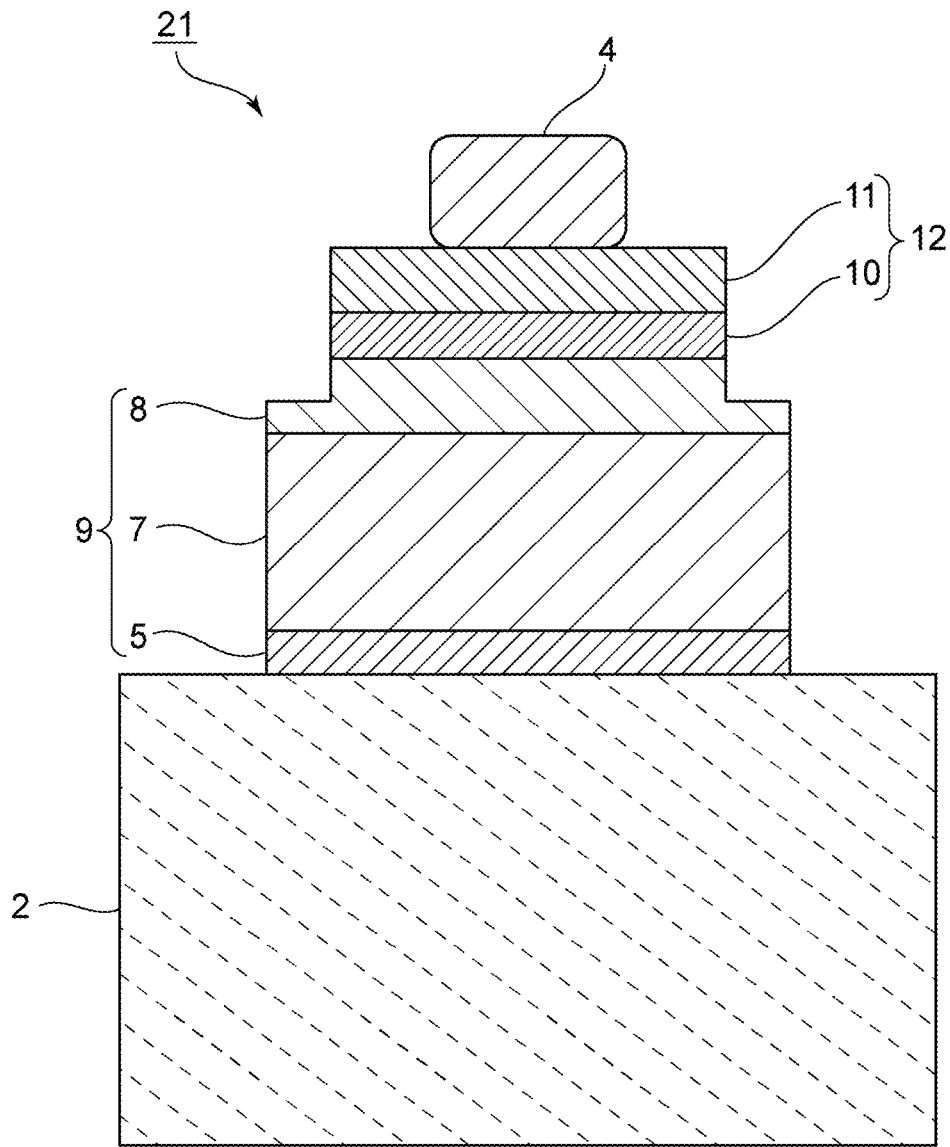
FIG. 14 is a sectional front view showing the electrode multilayer structure in an electronic component according to a second preferred embodiment of the present invention.
Figure 15:
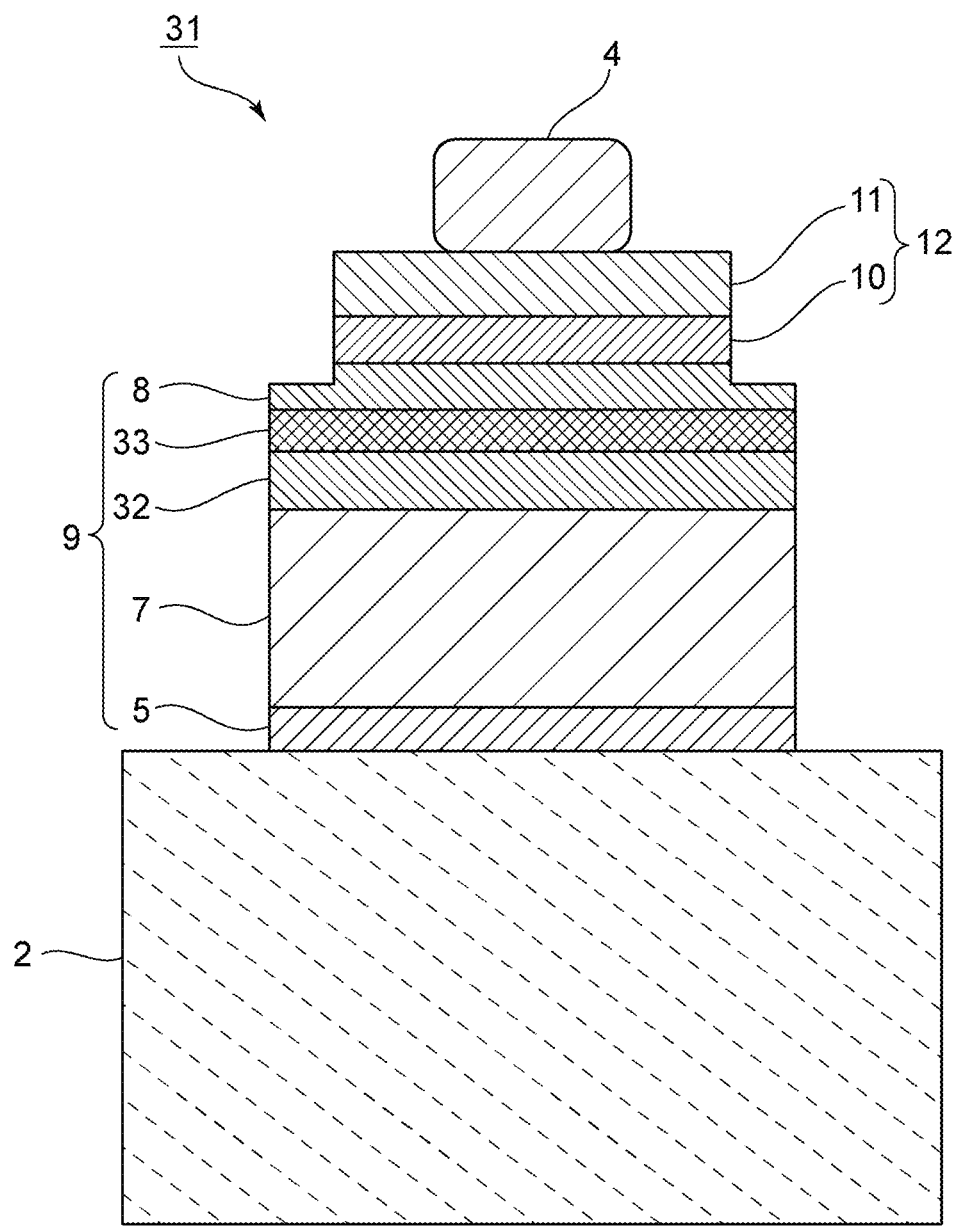
FIG. 15 is a sectional front view showing the electrode multilayer structure in an electronic component according to a third preferred embodiment of the present invention.

FIG. 14 is a sectional front view showing the electrode multilayer structure in an electronic component according to a second preferred embodiment of the present invention. FIG. 15 is a sectional front view showing the electrode multilayer structure in an electronic component according to a third preferred embodiment of the present invention.

As shown in FIG. 14, in an electronic component 21 according to the second preferred embodiment, the wiring electrode and the pad electrode 12 are stacked on the substrate 2 preferably made of LiNbO$_3$, for example. The wiring electrode 9 includes the first Ti layer 8 as the uppermost portion. The pad electrode 12 includes the second Ti layer 10 as the lowermost layer. In the pad electrode 12, the Au layer 11 is stacked on the second Ti layer 10.

In the wiring electrode 9, the AlCu layer 7 and the first Ti layer 8 are stacked in this order on the third Ti layer 5. Therefore, the Al layer 6 in the first preferred embodiment is omitted. The electrode multilayer structure in the electronic component 21 is the same or substantially the same as the electrode multilayer structure in the electronic component 1 of the first preferred embodiment except for the above-described points. In this regard, the first Ti layer 8 is provided with the raised portion A. Therefore, the thickness of the first Ti layer 8 outside the pad electrode 12 is decreased.

The Au bump 4 is bonded to the pad electrode 12.

In the electronic component 31 according to the third preferred embodiment shown in FIG. 15, regarding the wiring electrode 9, the third Ti layer 5, the AlCu layer 7, a fourth Ti layer 32, a Pt layer 33, and the first Ti layer 8 are successively stacked in this order from the substrate 2. Other configurations of the electronic component 31 are the same or substantially the same as the configurations of the electronic component 21. In this regard, the fourth Ti layer 32 is provided as a diffusion-preventing layer between the Pt layer 33 and the AlCu layer 7.

In each of the electronic component 21 and the electronic component 31 according to the second preferred embodiment and the third preferred embodiment, respectively, the first Ti layer 8 is provided with a raised portion. Therefore, since the thickness of the first Ti layer 8 outside the pad electrode 12 is decreased, the loss can be reduced. Meanwhile, the thickness of the first Ti layer 8 in the portion on which the Au bump 4 is superposed is relatively increased. Therefore, similar to the first preferred embodiment, the amount of Ti deposited on the surface of the Au layer 11 can be reduced. Consequently, the bonding strength between the Au bump 4 and the Au layer 11 can be improved.

In each of the second preferred embodiment and the third preferred embodiment, since the second Ti layer 10 is stacked directly on the first Ti layer 8, Au is significantly reduced or prevented from diffusing into the second Ti layer 10 and the first Ti layer 8. Consequently, the bonding strength between the Au bump 4 and the Au layer 11 can be improved.

In this regard, in the electronic component 21 of the second preferred embodiment, the bonding strength between the Au bump 4 and the Au layer 11 can be improved more effectively than in the electronic component 31 of the third preferred embodiment. This is because the electronic component 21 of the second preferred embodiment does not include the Pt layer 33. This will be described with reference to the specific experimental example.

Figure 16:
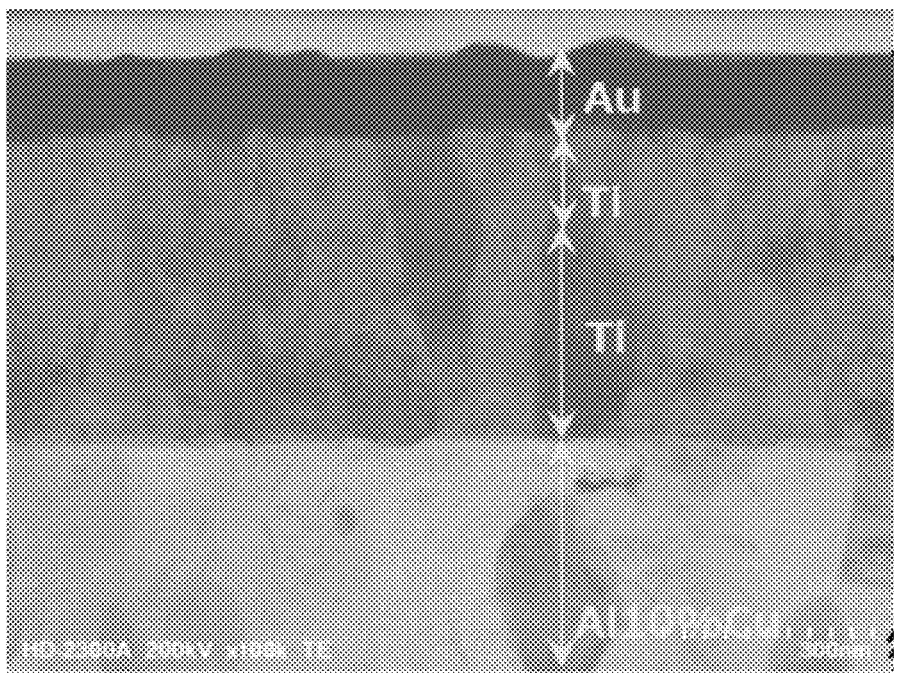
FIG. 16 is an STEM image of the electrode multilayer structure of example 1 according to the second preferred embodiment of the present invention.
Figure 17:
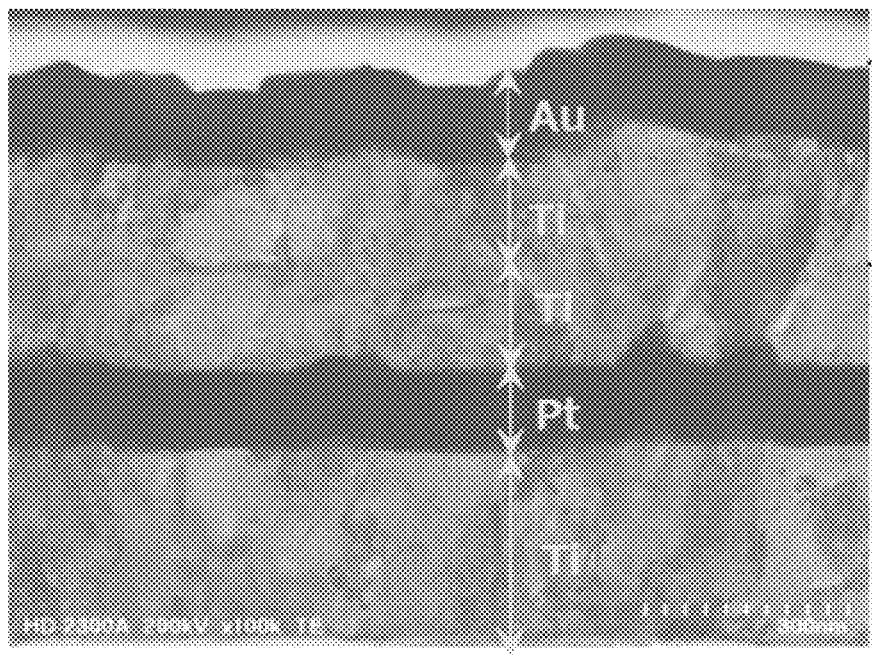
FIG. 17 is an STEM image of the electrode multilayer structure of example 2 according to the third preferred embodiment of the present invention.

FIG. 16 is an STEM image of the electrode multilayer structure of example 1 according to the second preferred embodiment. FIG. 17 is an STEM image of the electrode multilayer structure of example 2 according to the third preferred embodiment. The film thickness of the multilayer structure of each of example 1 and example 2 was set to be as described below.

Example 1

Wiring electrode 9:
Film thickness of third Ti layer 5: about 10 nm
Film thickness of AlCu layer 7: about 2,600 nm
Film thickness of first Ti layer 8 inside raised portion A: about 450 nm
Film thickness of first Ti layer 8 outside raised portion A: about 430 nm
Pad electrode 12:
Film thickness of second Ti layer 10: about 150 nm
Film thickness of Au layer 11: about 150 nm Example 2

Wiring electrode 9:
Film thickness of third Ti layer 5: about 10 nm
Film thickness of AlCu layer 7: about 2,600 nm
Film thickness of first Ti layer 8 inside raised portion A: about 150 nm
Film thickness of first Ti layer 8 outside raised portion A: about 120 nm
Film thickness of Pt layer 33: about 100 nm
Film thickness of fourth Ti layer 32: about 300 nm
Pad electrode 12:
Film thickness of second Ti layer 10: about 150 nm
Film thickness of Au layer 11: about 150 nm Therefore, in example 2, the total film thickness of the first Ti layer 8 and the fourth Ti layer 32 was about 450 nm and was equal or substantially equal to the film thickness of the first Ti layer 8 of about 450 nm in example 1.

It was discovered that, in FIG. 16, the surface of the Au layer 11 is relatively smooth, and in FIG. 17, the surface of the Au layer 11 was significantly roughened.

The surface roughness in each of example 1 and example 2 was measured on the basis of JIS R 1683. As a result, in example 1, the value of surface roughness Ra was about 8.1 nm, and in example 2, the value of surface roughness Ra was about 20.4 nm.

Therefore, it is preferable, for example, that a different type of metal layer such as a Pt layer 33 not be provided in the first Ti layer 8. Consequently, the surface smoothness of the Au layer is significantly improved, and the bonding strength between the Au bump 4 and the Au layer 11 is further improved. In addition, diffusion of Al in the wire electrode 9 and Au in the pad electrode 12 is significantly reduced or prevented. Consequently, the bonding strength between the Au layer 11 and the Au bump 4 can also be improved.

Figure 18:
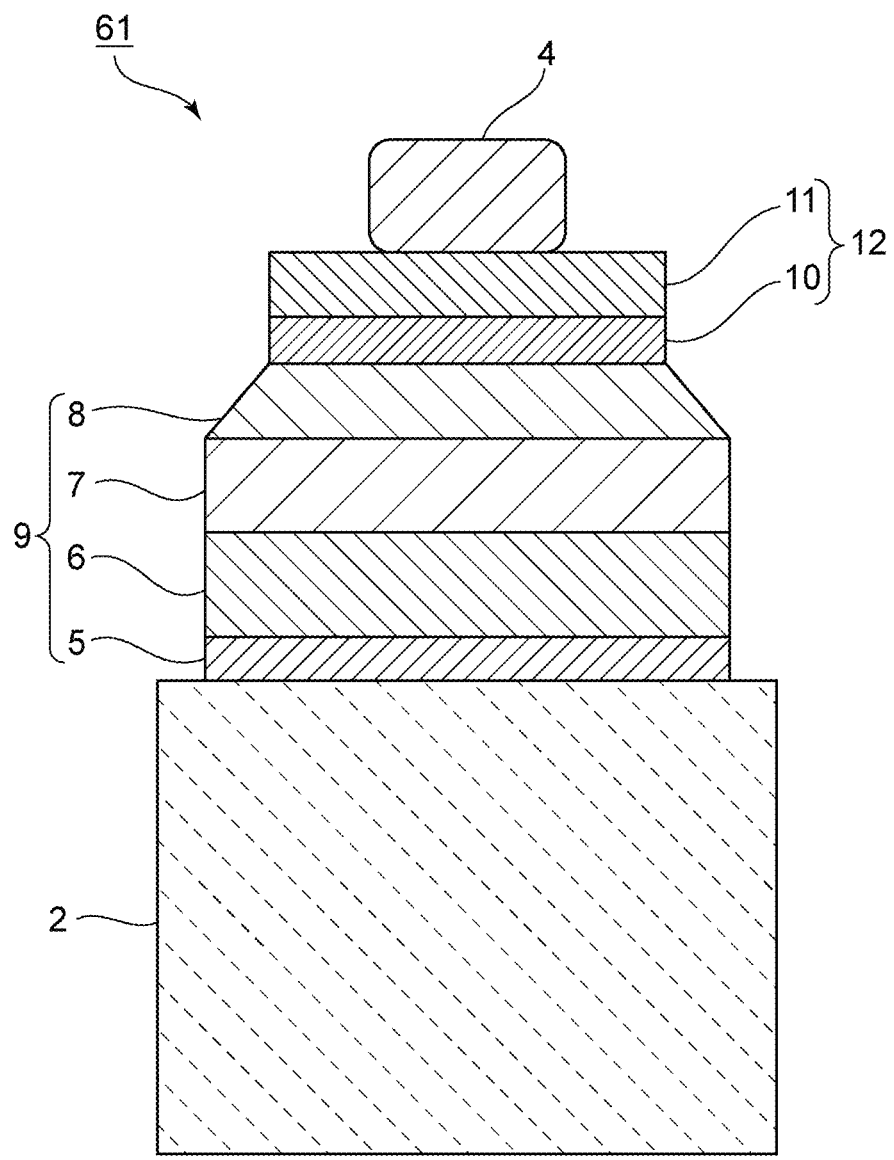
FIG. 18 is a sectional front view showing a key portion of an electronic component according to a fourth preferred embodiment of the present invention.

FIG. 18 is a sectional front view showing a key portion of an electronic component according to a fourth preferred embodiment of the present invention. In an electronic component 61, the first Ti layer 8 is tapered. The electronic component 61 is the same or substantially the same as the electronic component 1 except for the structure of the first Ti layer.

As shown in FIG. 18, the first Ti layer 8 tapers from the wiring electrode 9 to the pad electrode 12. The tapered portion is the portion outside the pad electrode 12 of the first Ti layer 8. Therefore, tapering sets the thickness of the first Ti layer 8 in the portion on the Au bump 4 is superposed to be greater than the thickness of the first Ti layer 8 outside the pad electrode 12 in plan view. Consequently, regarding the electronic component 61 according to the fourth preferred embodiment, the loss is reduced, and degradation in the bonding strength between the Au layer 11 and the Au bump 4 does not readily occur.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a wiring electrode;
a pad electrode provided on the wiring electrode; and
a Au bump provided on the pad electrode; wherein
an uppermost layer of the wiring electrode is a first Ti layer;
an uppermost layer of the pad electrode is a Au layer; and
a thickness of the first Ti layer in at least a first portion on which the Au bump is superposed in plan view is greater than a thickness of at least a second portion of the first Ti layer in a portion on the Au bump is not superposed in plan view.

2. The electronic component according to claim 1, wherein
the wiring electrode is larger than the pad electrode in plan view; and
the thickness of the first Ti layer in the first portion on which the Au bump is superposed in plan view is greater than a thickness of at least a third portion of the first Ti layer located outside the pad electrode in plan view.

3. The electronic component according to claim 2, wherein the thickness of the first Ti layer in the first portion on which the Au bump is superposed is greater than the thickness of the third portion of the first Ti layer located outside the pad electrode in plan view.

4. The electronic component according to claim 3, wherein
the third portion of the first Ti layer located outside the pad electrode tapers from the wiring electrode to the pad electrode; and
the thickness of the first Ti layer in the first portion on which the Au bump is superposed is greater than the thickness of the third portion of the first Ti layer located outside the pad electrode.

5. The electronic component according to claim 1, wherein the first Ti layer includes a raised portion and a thickness inside the raised portion is less than a thickness outside the raised portion in plan view.

6. The electronic component according to claim 1, wherein
the wiring electrode includes an Al layer;
the pad electrode includes a second Ti layer; and
the second Ti layer is stacked on the first Ti layer of the wiring electrode.

7. The electronic component according to claim 6, wherein the second Ti layer is stacked directly on the first Ti layer.

8. The electronic component according to claim 6, wherein the thickness of the first Ti layer of the wiring electrode is less than a thickness of the second Ti layer of the pad electrode.

9. The electronic component according to claim 6, wherein the thickness of the first Ti layer of the wiring electrode is greater than a thickness of the second Ti layer of the pad electrode.

10. The electronic component according to claim 1, wherein the wiring electrode includes a third Ti layer that is provided on a substrate.

11. The electronic component according to claim 10, wherein the third Ti layer, an AlCu layer, and the first Ti layer are provided in this order on the substrate.

12. The electronic component according to claim 10, wherein the third Ti layer, an Al layer, an AlCu layer, and the first Ti layer are provided in this order on the substrate.

13. The electronic component according to claim 10, wherein the substrate is an $LiNbO_3$ substrate.

* * * * *